United States Patent
Joo et al.

(10) Patent No.: US 12,230,697 B2
(45) Date of Patent: Feb. 18, 2025

(54) SEMICONDUCTOR DEVICE AND METHOD OF MANUFACTURING THE SAME

(71) Applicants: Hyundai Motor Company, Seoul (KR); Kia Corporation, Seoul (KR)

(72) Inventors: NackYong Joo, Suwon-si (KR); Dae Hwan Chun, Suwon-si (KR); Jungyeop Hong, Seoul (KR); Youngkyun Jung, Seoul (KR); Junghee Park, Suwon-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 426 days.

(21) Appl. No.: 17/663,866

(22) Filed: May 18, 2022

(65) Prior Publication Data
US 2023/0045172 A1  Feb. 9, 2023

(30) Foreign Application Priority Data
Jul. 29, 2021 (KR) .......... 10-2021-0099563

(51) Int. Cl.
*H01L 29/739* (2006.01)
*H01L 29/16* (2006.01)
*H01L 29/423* (2006.01)
*H01L 29/66* (2006.01)

(52) U.S. Cl.
CPC ...... *H01L 29/7397* (2013.01); *H01L 29/1608* (2013.01); *H01L 29/4236* (2013.01); *H01L 29/66325* (2013.01)

(58) Field of Classification Search
CPC ............ H01L 29/7397; H01L 29/1608; H01L 29/4236; H01L 29/66325
USPC .......................................................... 257/253
See application file for complete search history.

(56) References Cited

U.S. PATENT DOCUMENTS

| | | | |
|---|---|---|---|
| 2013/0200451 A1* | 8/2013 | Yilmaz | H01L 29/086 438/270 |
| 2016/0247910 A1* | 8/2016 | Suzuki | H01L 29/66068 |
| 2019/0035928 A1 | 1/2019 | Minamisawa | |
| 2019/0123172 A1 | 4/2019 | De-Michielis | |

FOREIGN PATENT DOCUMENTS

| | | | | |
|---|---|---|---|---|
| JP | 2010219361 A | | 9/2010 | |
| JP | 209517132 A1 | | 1/2019 | |
| JP | 2019514215 A1 | | 4/2019 | |
| KR | 20210009005 | * | 1/2021 | ....... H01L 29/66666 |
| KR | 20210075703 | * | 6/2021 | ........... H01L 29/772 |

* cited by examiner

*Primary Examiner* — Igwe U Anya
(74) *Attorney, Agent, or Firm* — MCDONNELL BOEHNEN HULBERT & BERGHOFF LLP

(57) ABSTRACT

A semiconductor device includes an N+ type substrate, an N− type layer disposed on a first surface of the N+ type substrate and having a trench opened to a surface opposite to the surface facing the N+ type substrate, a P type region disposed in the N− type layer and disposed on a side surface of the trench, a gate electrode disposed in the trench, and a source electrode and a drain electrode insulated from the gate electrode. The N− type layer includes a P type shield region covering a bottom surface and an edge of the trench.

26 Claims, 22 Drawing Sheets

SEMICONDUCTOR DEVICE AND METHOD OF MANUFACTURING THE SAME

CROSS-REFERENCE TO RELATED APPLICATIONS

This application claims priority to and the benefit of Korean Patent Application No. 10-2021-0099563 filed in the Korean Intellectual Property Office on Jul. 29, 2021, the entire contents of which are incorporated herein by reference.

TECHNICAL FIELD

The present disclosure relates to a silicon carbide (SiC)-based semiconductor device including a trench gate and a method for manufacturing the same.

BACKGROUND

Semiconductor devices (MOSFETs, JFETs, MESFETs, IGBTs, etc.) are three-terminal devices capable of conducting current through a control of the gate terminal. In particular, power semiconductor transistors for switching require high voltage and large current. Silicon carbide (SiC)-based electric power semiconductor devices exhibit higher voltage and larger current characteristics than Si devices and thus are being actively researched and commercialized.

The semiconductor devices have different electrical characteristics depending on a structure and are appropriately used depending on an application field. However, the semiconductor devices commonly require high current density, a low turn-on voltage, a high breakdown voltage, a low leakage current, and a fast switch speed, and in order to simultaneously satisfy these requirements, various structures have been proposed. However, since these above electrical characteristics have trade-off relationship one another, studies on weakening the trade-off relationship to provide structures for improving at least one characteristic as well as maintaining the other characteristics are being continuously made.

In particular, as for SiC trench MOSFET, since an oxide film is destroyed by a strong electric field formed in a gate oxide film and thereby, reduces a breakdown voltage, structures for protecting the oxide film are required.

SUMMARY

An embodiment provides a semiconductor device that protects an oxide film at the edge portion of the trench gate, and thus may prevent the oxide film from being destroyed and a breakdown voltage from being reduced due to a concentration of an electric field on the oxide film at the edge portion of the trench gate, and may prevent a current being reduced due to ion implantation to protect the edge portion of the trench gate, in particular, in a SiC-based semiconductor device.

Another embodiment provides a method for manufacturing a semiconductor device that effectively manufacture a P type shield region covering the edge portion of the trench gate in a SiC-based semiconductor device in which horizontal diffusion of ions does not occur well, and that does not require a development of a new process technology because a conventional ion implantation process and an epitaxial process are used.

According to an embodiment, a semiconductor device includes an N+ type substrate, an N− type layer disposed on a first surface of the N+ type substrate and having a trench opened to a surface opposite to the surface facing the N+ type substrate, a P type region disposed in the N− type layer and disposed on a side surface of the trench, a gate electrode disposed in the trench, and a source electrode and a drain electrode insulated from the gate electrode, wherein the N− type layer includes a P type shield region covering a bottom surface and an edge of the trench.

The N− type layer may include an N type current diffusion region disposed on a side surface of the trench.

The N type current diffusion region may be disposed on the P type shield region. The P type shield region and the N type current diffusion region may be connected to each other to cover the bottom and side surfaces of the trench.

The trench may include a first trench region disposed in the P type region and having a first width, and a second trench region disposed in the N− type layer and having a second width, wherein the first width of the first trench region may be wider than the second width of the second trench region.

The first width of the first trench region may be the same as a width of the P type shield region.

A bottom surface of the first trench region having the first width may be disposed in the P type region and not in the N− type layer.

The second width of the second trench region may be narrower than a width of the P type shield region.

A bottom surface of the second trench region having the second width may pass through the N type current diffusion region and be disposed in the P type shield region.

The N type current diffusion region may be disposed under a bottom surface of the first trench region having a first width, a side surface of the second trench region having a second width, and on an upper portion of the P type shield region.

The gate electrode may have a third width in the P type region and a fourth width in the N− type layer, and the third width of the gate electrode may be wider than the fourth width.

The semiconductor device may further include a first insulating layer disposed between the trench and the gate electrode.

The gate electrode may include a first gate electrode region disposed in the trench and a second gate electrode region protruding above the trench.

The semiconductor device may further include a second insulating layer covering the second gate electrode region protruding above the trench.

The source electrode may be disposed on the N− type layer, and the drain electrode may be disposed on the second surface of the substrate.

Another embodiment provides a method of manufacturing a semiconductor device that includes forming an N− type layer on the first surface of an N+ type substrate, forming a P type region in the N− type layer, implanting P type ions with a first width into the N− type layer and the P type region to form a P type ion implantation region, implanting N type ions with a first width to a partial depth of the P type ion implantation region to form an N type ion implantation region and a P type shield region under the N type ion implantation region, etching the N type ion implantation region and the P type shield region to form a trench, forming a gate electrode inside the trench, and forming a source electrode and a drain electrode to be insulated from the gate electrode, respectively.

The forming of the P type ion implantation region may include forming a first mask having an opening of a first width on the P type region, and then using the first mask, implanting P type ions into the N− type layer and the P type region with a first width to form a P type ion implantation region.

The forming of the P type shield region may be performed by using an ion doping neutralization (compensation) method.

A difference between an amount of N type ions implanted to form the N type ion implantation region and an amount of P type ions implanted to form the P type ion implantation region may be greater than the ion implantation concentration of the N-type layer.

The forming of the trench may include etching the N type ion implantation region to a partial depth using a first mask to form a first trench region having a first width.

The etching of the N type ion implantation region may be performed such that the bottom surface of the first trench region having the first width is disposed in the P type region and not in the N− type layer.

The forming of the trench may include forming a second mask having an opening having a second width on a side surface of the first trench region, and then using the second mask, etching the P type shield region to a partial depth penetrating the N type ion implantation region to form a second trench region having a second width.

The etching of the P type shield region may be performed such that the bottom surface of the second trench region having the second width passes through the N type current diffusion region and is disposed in the P type shield region.

The method of manufacturing the semiconductor device may further include forming a first insulating layer on the bottom and side surfaces of the second trench region, the bottom and side surfaces of the first trench region, and the P type region.

The method of manufacturing the semiconductor device may further include forming a second insulating layer on the gate electrode after forming the gate electrode in the trench.

The method of manufacturing the semiconductor device may further include forming an N+ type region disposed in the P type region and disposed on a side surface of the trench.

The method of manufacturing the semiconductor device may further include forming a source electrode on the P type region to be insulated from the gate electrode.

The method of manufacturing the semiconductor device may further include forming a drain electrode on the second surface of the substrate.

The semiconductor device according to an embodiment protects an oxide film at the edge portion of the trench gate, and thus may prevent the oxide film from being destroyed and a breakdown voltage from being reduced due to a concentration of an electric field on the oxide film at the edge portion of the trench gate, and may prevent a current being reduced due to ion implantation to protect the edge portion of the trench gate, in particular, in a SiC-based semiconductor device.

The method of manufacturing the semiconductor device according to another embodiment may effectively provide a P type shield region covering the edge portion of the trench gate in a SiC-based semiconductor device in which horizontal diffusion of ions does not occur well, and may not require a development of a new process technology because a conventional ion implantation process and an epitaxial process are used.

DETAILED DESCRIPTION

Figure 1:
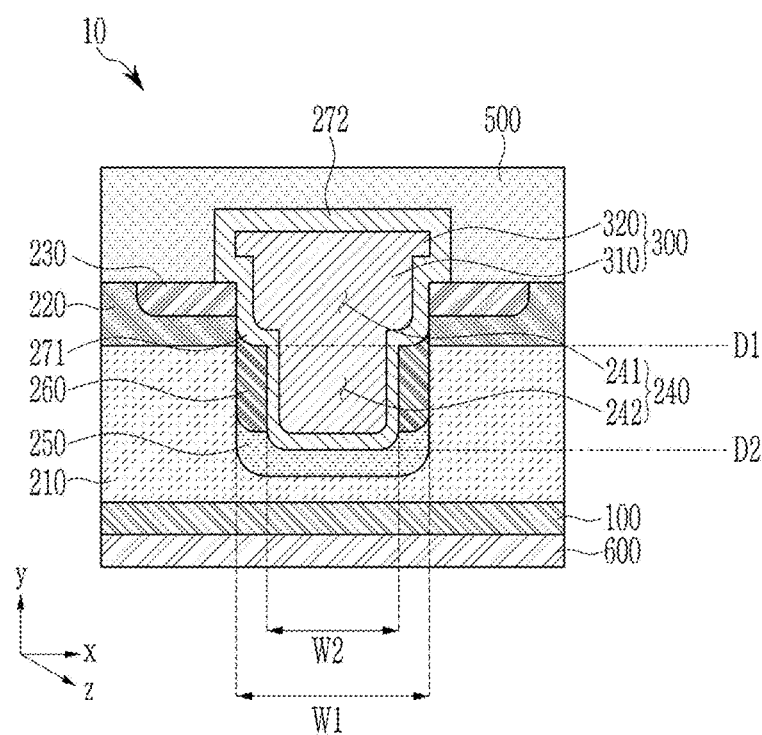
FIG. 1 is a view illustrating a cross-section of a semiconductor device according to an embodiment.

The advantages and features of the present disclosure and the methods for accomplishing the same will be apparent from the embodiments described hereinafter with reference to the accompanying drawings. However, the embodiments should not be construed as being limited to the embodiments set forth herein. Unless otherwise defined, all terms (including technical and scientific terms) used herein have the same meaning as commonly understood by one of ordinary skill in the art. The terms defined in a generally-used dictionary may not be interpreted ideally or exaggeratedly unless clearly defined. In addition, unless explicitly described to the contrary, the word "comprise", and variations such as "comprises" or "comprising", will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

FIG. 1 is a view illustrating a cross-section of a semiconductor device 10 according to an embodiment. FIG. 1 is a cross-sectional view taken in a direction perpendicular to a direction in which the gate electrode 300 extends.

For example, a direction in which the gate electrode 300 extends may be a Z direction, and a direction perpendicular to the Z direction may be an X direction and a Y direction. Hereinafter, in the present specification, the X direction may be referred to as a width direction, the Y direction may be referred to as a height direction, and a direction opposite to the Y direction may be referred to as a depth direction. Also, in this specification, the Y direction may be referred to as an upper direction, and a direction opposite to the Y direction may be referred to as a lower direction.

A semiconductor device 10 includes an N+ type substrate 100, an N− type layer 210, a P type region 220, a gate electrode 300, a source electrode 500, and a drain electrode 600.

For example, the N+ type substrate 100 may be an N+ type silicon carbide (SiC) substrate. The N− type layer 210 is disposed on a first surface of the N+ type substrate 100. The N− type layer 210 may be formed by epitaxial growth or implantation of N− type ions.

The N− type layer 210 includes a trench 240. The trench 240 is opened toward an opposite side to the side where the N− type layer 210 faces the N+ type substrate 100. In other words, the trench 240 is opened to the Y direction in FIG. 1.

The P type region 220 is disposed in the N− type layer 210 and on the side surface of the trench 240. For example, the P type region 220 may be disposed on the upper direction (Y direction) surface of the N− type layer 210. The P type region 220 is a region where P type ions are implanted into the N− type layer 210.

Optionally, an N+ type region 230 may be disposed in the P type region 220 and on the side surface of the trench 240. For example, the N+ type region 230 may be disposed on the upper direction (Y direction) surface of the P type region 220. Accordingly, the N− type layer 210, the P type region 220, and the N+ type region 230 may be sequentially disposed in the upper direction (Y direction) on the side surface of the trench 240. The ions may be implanted at a higher concentration into the N+ type region 230 than into the N− type layer 210.

A first insulating layer 271 may be disposed inside the trench 240, and on the first insulating layer 271, the gate electrode 300 is disposed. In other words, the first insulating layer 271 is disposed between the trench 240 and the gate electrode 300.

The gate electrode 300 may include a first gate electrode region 310 filling the trench 240 and a second gate electrode region 320 protruding outside the trench 240.

On the second gate electrode region 320 protruded outside the trench 240, a second insulating layer 272 is disposed. Optionally, the second insulating layer 272 may be disposed on the N+ type region 230, on the P type region 220, or on the N− type layer 210.

The gate electrode 300 may include polysilicon or a metal. The first insulating layer 271 or the second insulating layer 272 may include $SiO_2$, $Si_3N_4$, or a combination thereof. On the N− type layer 210, the source electrode 500 is disposed. The source electrode 500 may be disposed on the P type region 220, the N+ type region 230, and/or the N− type layer 210. The source electrode 500 may be insulated from the gate electrode 300 by the second insulating layer 272. The source electrode 500 may include Cr, Pt, Pd, Au, Ni, Ag, Cu, Al, Mo, In, Ti, polycrystalline Si, oxides thereof, nitrides thereof, or alloys thereof. In addition, the source electrode 500 may include a multi-layer electrode structure of stacked different metal layers, for example, Pt/Au, Pt/Al, Pd/Au, Pd/Al, or Pt/Ti/Au and Pd/Ti/Au.

The drain electrode 600 is disposed on a second surface of the N+ type substrate 100. Optionally, the drain electrode 600 may also be disposed on the N− type layer 210. The drain electrode 600 may include Cr, Pt, Pd, Au, Ni, Ag, Cu, Al, Mo, In, Ti, polycrystalline Si, oxides thereof, nitrides thereof, or alloys thereof. In addition, the drain electrode 600 may include a multi-layer electrode structure of stacked different metal layers, for example, Ti/Au or Ti/Al.

On the other hand, the N− type layer 210 includes a P type shield region 250 disposed under the bottom surface D2 of the trench 240. The P type shield region 250 has a structure for protecting the first insulating layer 271 of the trench 240.

The P type shield region 250 covers the bottom surface D2 and edges of the trench 240. Herein, the edges of the trench 240 indicate edges where the bottom surface D2 of the trench 240 meets the sides of the trench. The edges of the trench 240 are a region where an electric field is most strongly applied, and the P type shield region 250 may cover the edges of the trench 240 and thus weaken the electric field at the edges of the trench 240.

However, since silicon carbide (SiC) is not well diffused in a horizontal direction during the ion implantation, the P type shield region 250 covering the edges of the trench 240 are difficult to form.

Figure 2:
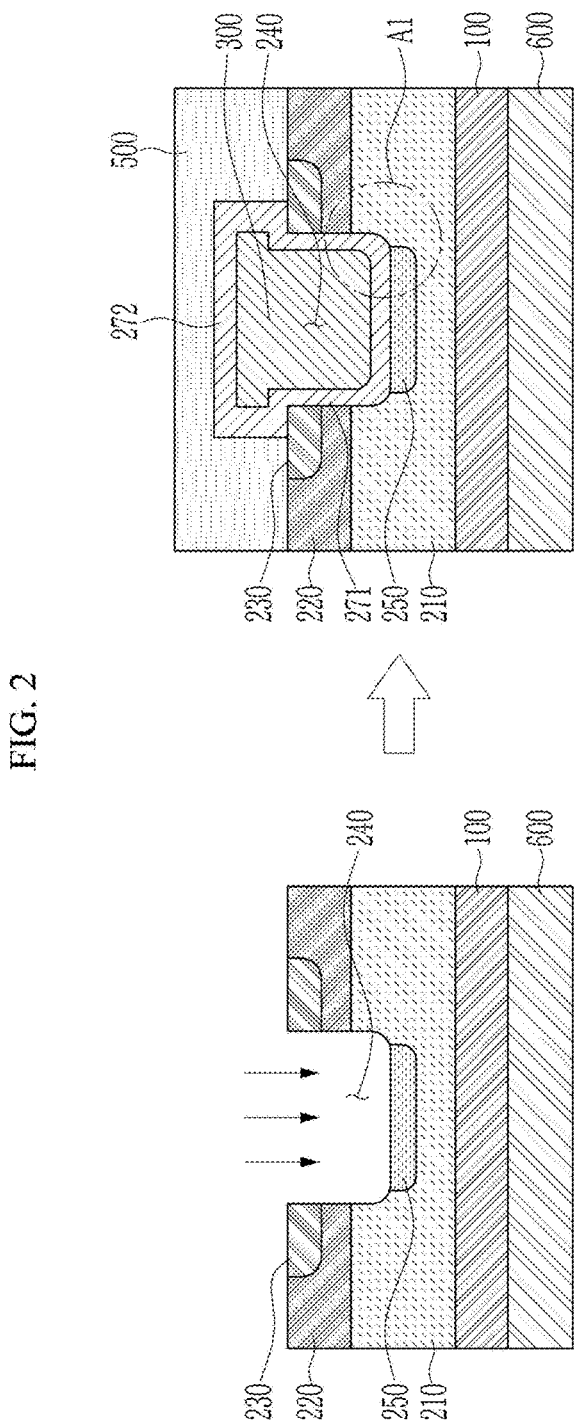
FIG. 2 is a view showing a cross-section of a conventional method of manufacturing a semiconductor device and a semiconductor device manufactured by the method.
Figure 3:
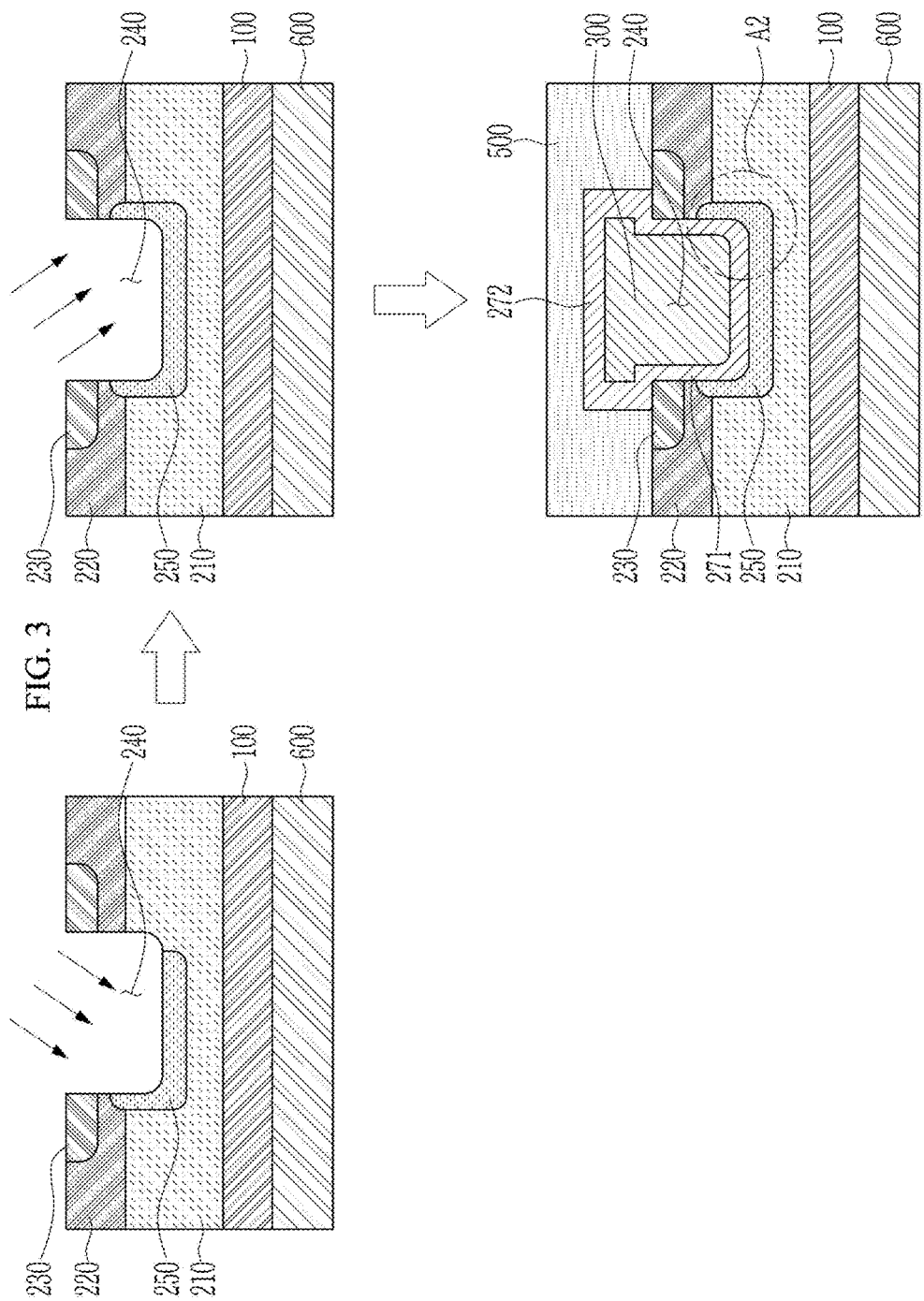
FIG. 3 is a view showing a cross-section of a conventional method of manufacturing a semiconductor device and a semiconductor device manufactured by the method.

FIGS. 2 and 3 are views showing cross-sections of conventional methods for manufacturing a semiconductor device 10 and semiconductor devices manufactured by the methods.

Referring to FIG. 2, when the P type shield region 250 is formed by implanting ions perpendicularly (tilt 0°) to the bottom surface of the trench 240, since the ions are not well diffused in the horizontal direction during implantation of the ions, the P type shield region 250 may not be formed to cover the edges of the trench 240 (refer to a region A1 of FIG. 2). Accordingly, the edges of the trench 240 are exposed to an epitaxial region and not protected by the P type shield region 250.

Referring to FIG. 3, when the P type shield region 250 is formed on the bottom surface of the trench 240 through tilt ion implantation, the P type shield region 250 may also be formed in the P type region 220 and have a problem of blocking a current path (refer to a region A2 of FIG. 3). Herein, although a voltage is applied to the gate electrode 300, the current path is not formed, not conducting a current.

Accordingly, as the semiconductor device 10 according to an embodiment is manufactured using inter-ion neutralization (compensation) phenomenon, through a structure including a P type shield region 250 and an N type current diffusion region 260, the above problems may be solved.

The N type current diffusion region 260 is disposed in the N− type layer 210 on the side surface of the trench 240. The ion concentration of the N type current diffusion region 260 has an ion concentration (doping concentration) that is equal to or greater than that of the N− type layer 210.

When a voltage is applied to the gate electrode 300, the N type current diffusion region 260 serves as a current path through which a current is conducted. Thereby, current reduction does not occur even when the P type shield region 250 is formed.

Specifically, in the off state, the current path is blocked by the depletion layer formed by the P type region 220 and the P type shield region 250. In this case, the first insulating layer 271 is protected by the P type shield region 250 covering the edges of the trench 240.

In the on state, a current is conducted through the channel formed by the gate voltage. In this case, the resistance increased due to the interference of the current path of the P type shield region 250 is offset due to the decrease in resistance caused by the formation of the current path by the N type current diffusion region 260.

For reference, the operating conditions of the semiconductor device 10 are as follows.

Off state: $V_{GS} < V_{TH}$, $V_{DS} \geq 0$ V
On state: $V_{GS} \geq V_{TH}$, $V_{DS} > 0$ V Herein, $V_G$ is a gate voltage, $V_D$ is a drain voltage, $V_S$ is a source voltage, $V_{TH}$ is threshold voltage of a semiconductor device 10, $V_{GS} = V_G - V_S$, and $V_{DS} = V_D - V_S$.

The N type current diffusion region 260 may be disposed on the P type shield region 250 covering the edges of the trench 240 and the P type shield region 250 and the N type current diffusion region 260 may be connected to each other to cover the bottom surface D2 and the side surface of the trench 240 positioned in the N− type layer 210. In this case, an effect of forming a current path by the N type current diffusion region 260 may be increased.

As the semiconductor device 10 includes the P type shield region 250 and the N type current diffusion region 260, the trench 240 may include a first trench region 241 disposed in the P type region 220 and having a first width W1 and a second trench region 242 disposed in the N− type layer 210 and having a second width W2.

In this case, the first width W1 of the first trench region 241 may be wider than the second width W2 of the second trench region 242. The first width W1 of the first trench region 241 may be equal to the width of the P type shield region 250, and the second width W2 of the second trench region 242 may be narrower than the width of the P type shield region 250. Accordingly, the edge of the bottom surface D2 of the second trench region 242 may be protected by the P type shield region 250.

The bottom surface D1 of the first trench region 241 having the first width W1 may be disposed in the P type region 220, and the bottom surface D1 of the first trench region 241 may not be disposed in the N− type layer 210. Accordingly, the entire side surface of the gate electrode 300 disposed in the N− type layer 210 is protected by the N type current diffusion region 260 to increase the resistance reduction effect.

The bottom surface D2 of the second trench region 242 having the second width W2 may pass through the N type current diffusion region 260 and be disposed in the P type shield region 250. Accordingly, the edge of the bottom surface D2 of the second trench region 242 may be completely protected by the P type shield region 250.

Accordingly, the N type current diffusion region 260 may be disposed under the bottom surface D1 of the first trench region 241 having the first width W1, on the side surface of the second trench region 242 having the second width W2, and on an upper portion of the P type shield region 250.

In addition, according to the shape of the trench 240, the gate electrode 300 also has a third width in the P type region 220, and a fourth width in the N− type layer 210, and the third width of the gate electrode 300 may be wider than the fourth width. Herein, the third width of the gate electrode 300 is a width excluding the thickness of the first insulating layer 271 from the first width W1 of the trench 240, and the fourth width of the gate electrode 300 is a width excluding the thickness of the first insulating layer 271 from the second width W2 of the trench 240.

FIGS. 4 to 14 are views sequentially illustrating each step of a method for manufacturing a semiconductor device according to an embodiment. In FIGS. 4 to 14, only the main processes are shown, and the order may be changed depending on process environments and conditions.

Figure 4:
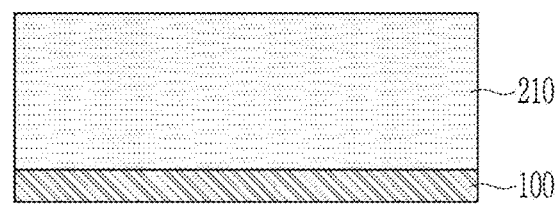
FIG. 4 is a view illustrating a step of a method of manufacturing a semiconductor device according to another embodiment.

Referring to FIG. 4, the N− type layer 210 is formed on the first surface of the N+ type substrate 100. For example, after preparing the N+ type substrate 100, the N− type layer 210 is formed on the first surface of the N+ type substrate 100 through epitaxial growth.

Figure 5:
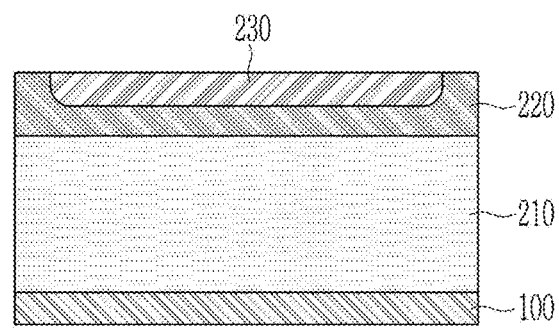
FIG. 5 is a view illustrating another step of a method of manufacturing a semiconductor device according to another embodiment.

Referring to FIG. 5, on the N− type layer 210, the P type region 220 is formed. For example, the P type region 220 is formed by implanting ions into an upper region of the N− type layer 210. Optionally, the N+ type region 230 may be further formed by implanting ions into a portion of the upper region of the P type region 220. Herein, the P type region 220 and the N+ type region 230 may be formed not by the ion implantation but by the epitaxial growth.

Next, P type ions are implanted into the N− type layer 210 and the P type region 220 with a first width W1 to form the P type ion implantation region 251.

Figure 6:
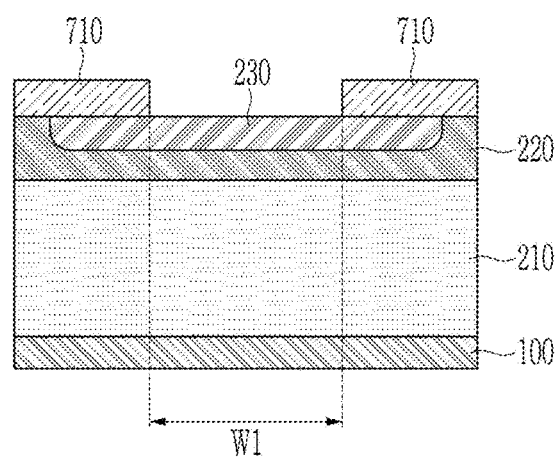
FIG. 6 is a view illustrating another step of a method of manufacturing a semiconductor device according to another embodiment.

Referring to FIG. 6, a first mask 710 having an opening having a first width W1 is formed on the P type region 220. In this case, when the N+ type region 230 is further included, the first mask 710 may also be formed on the N+ type region 230. The first mask 710 may be, for example, a hard mask including $Si_2N_3$.

Figure 7:
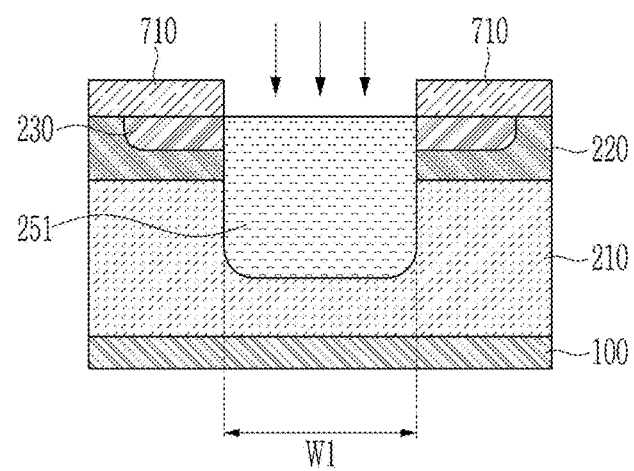
FIG. 7 is a view illustrating another step of a method of manufacturing a semiconductor device according to another embodiment.

Referring to FIG. 7, using the first mask 710, P type ions are implanted into the N− type layer 210 and P type region 220 with a first width W1 to form the P type ion implantation region 251. In this case, when the N+ type region 230 is further included, P type ions are also implanted into N+ type region 230 to form the P type ion implantation region 251.

Next, N type ions are implanted with a first width W1 to a partial depth of the P type ion implantation region 251 to form an N type ion implantation region 261 and a P type shield region 250 under the N type ion implantation region 261.

Figure 8:
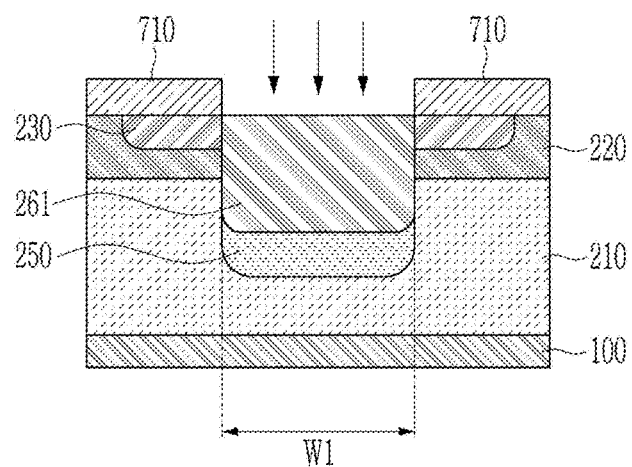
FIG. 8 is a view illustrating another step of a method of manufacturing a semiconductor device according to another embodiment.

Referring to FIG. 8, N type ions are implanted into the N- type layer 210 and P type region 220 with a first width W1 using the first mask 710. In this case, when the N+ type region 230 is further included, N type ions may be implanted into the N+ type region 230.

The implanted N type ions offset doping of the P type ions implanted to form the P type ion implantation region 251.

That is, the method of manufacturing the semiconductor device 10 according to another embodiment uses such an inter-ion neutralization phenomenon, so that even in the semiconductor device 10 based on silicon carbide (SiC), the P type shield region 250 having a shape covering the edges of the trench 240 may be formed. Herein, when the implantation dose of the N type ions and the implantation dose of the P type ions are equal, and the amount of ions (ion implantation concentration, or doping concentration) that is activated by heat treatment to determine the semiconductor type becomes zero (0), it is called inter-ion neutralization (compensation).

In order to form the N type ion implantation region 261 using the inter-ion neutralization (compensation) phenomenon, N type ions are implanted with an implantation amount of N type ions equal to or greater than the implantation amount of P type ions. At this time, the ion implantation concentration of the P type ion implantation region 251 is greater than the ion implantation concentration of the N− type layer 210. A difference between the implantation amount of N type ions and the implantation amount of P type ions may be greater than the ion implantation concentration of the N− type layer 210, and in this case, the ion implantation concentration of the N− type layer 210 may be greater than zero. Herein, the implantation amount of P type ions is an amount of P type ions implanted to form the P type ion implantation region 251, and the implantation amount of N type ions is an amount of N type ions implanted to form the N type ion implantation region 261.

Figure 9:
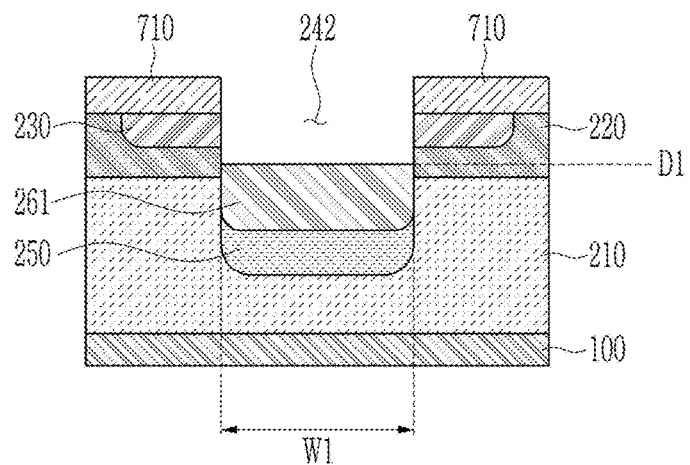
FIG. 9 is a view illustrating another step of a method of manufacturing a semiconductor device according to another embodiment.

Referring to FIG. 9, the N type ion implantation region 261 is etched to a partial depth using the first mask 710 to form a first trench region 241 having a first width W1. That is, P type ions implantation, N type ion implantation, and the first trench region 241 may be formed using one first mask 710.

In this case, in the etching of the N type ion implantation region 261, the bottom surface D1 of the first trench region 241 having the first width W1 may be disposed in the P type region 220, and the may not be disposed in the N− type layer 210. Accordingly, the entire side surface of the gate electrode 300 disposed in the N− type layer 210 is protected by the N type current diffusion region 260 to increase the resistance reduction effect.

Figure 10:
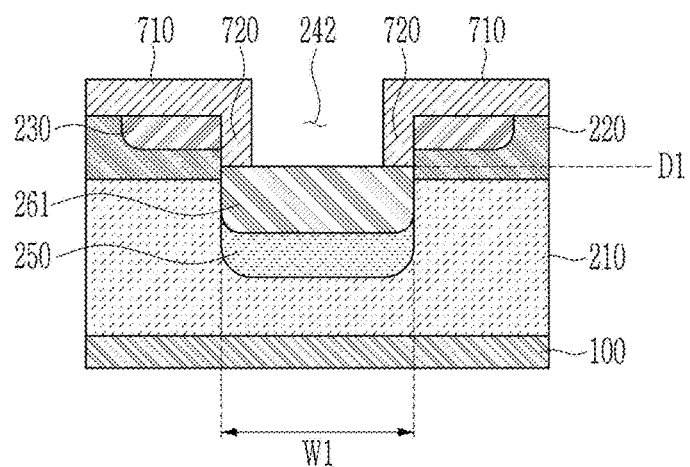
FIG. 10 is a view illustrating another step of a method of manufacturing a semiconductor device according to another embodiment.

Referring to FIG. 10, a second mask 720 having an opening having a second width W2 is formed on a side surface of the first trench region 241. The second mask 720 may be, for example, a hard mask including $Si_2N_3$.

Figure 11:
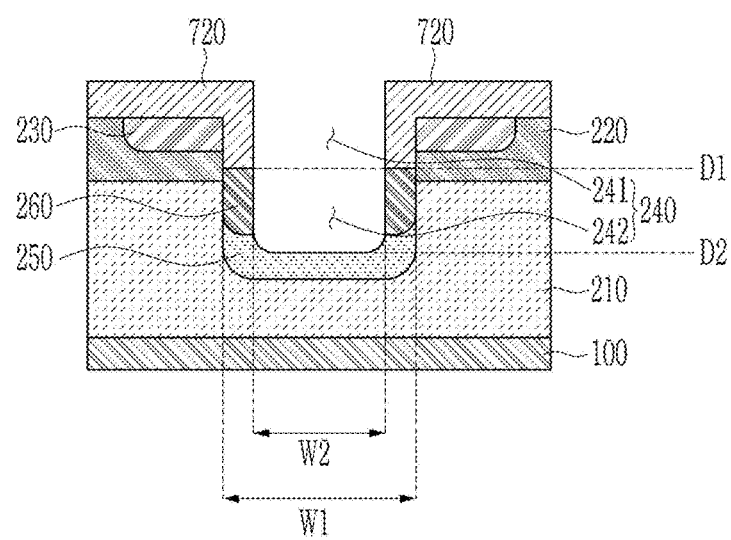
FIG. 11 is a view illustrating another step of a method of manufacturing a semiconductor device according to another embodiment.

Referring to FIG. 11, the P type shield region 250 is etched to a partial depth through the N type ion implantation region 261 using the second mask 720 to form a second trench region 242 having have a second width W2.

Figure 12:
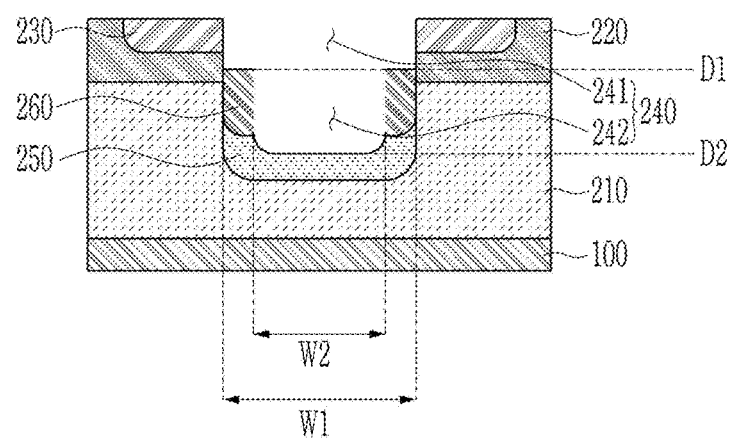
FIG. 12 is a view illustrating another step of a method of manufacturing a semiconductor device according to another embodiment.
Figure 13:
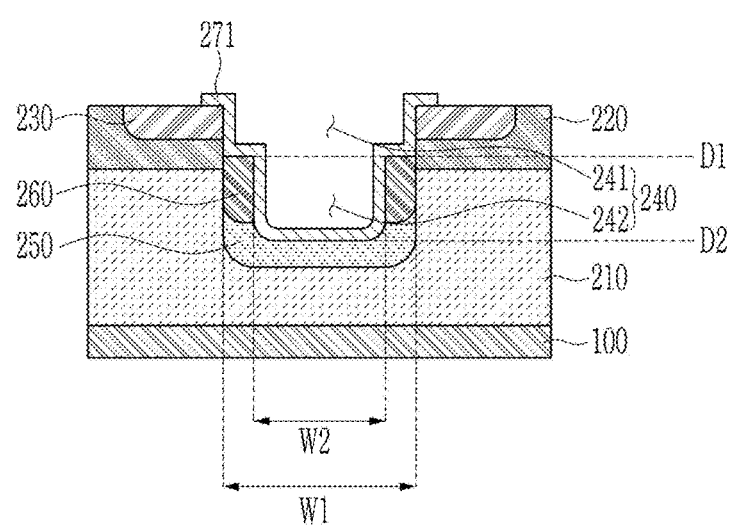
FIG. 13 is a view illustrating another step of a method of manufacturing a semiconductor device according to another embodiment.

Referring to FIGS. 12 and 13, after the first mask 710 and the second mask 720 are removed, a first insulating layer 271 is formed in the trench 240.

Figure 14:
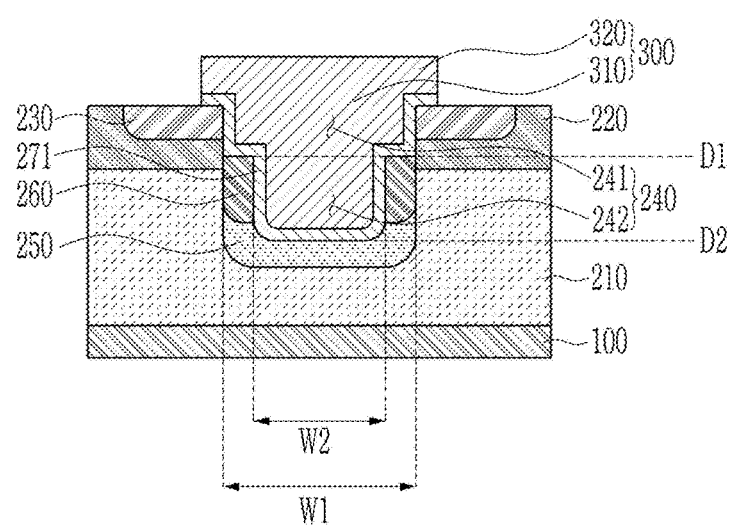
FIG. 14 is a view illustrating another step of a method of manufacturing a semiconductor device according to another embodiment.

Referring to FIG. 14, the gate electrode 300 is formed in the trench 240 in which the first insulating layer 271 is formed. In this case, the first gate electrode region 310 may be formed by filling the inside of the trench 240, and a second gate electrode region 320 protruding outside the trench 240 may be further formed.

Thereafter, a second insulating layer 272 is formed on the second gate electrode region 320 protruding to the outside of the trench 240, and a source electrode 500 is formed on the P type region 220, the N+ type region 230, and/or the N− type epitaxial layer. The source electrode 500 is insulated from the gate electrode 300 by the second insulating layer 272.

Finally, the semiconductor device 10 shown in FIG. 1 is manufactured by forming the drain electrode 600 on the second surface of the N+ type substrate 100.

The method of manufacturing the semiconductor device according to another embodiment may effectively provide the P type shield region 250 covering the edge portion of the trench 240 in an SiC-based semiconductor device 10 in which horizontal diffusion of ions does not occur well, and may not require a development of a new process technology because a conventional ion implantation process and an epitaxial process are used.

Hereinafter, specific examples of the present disclosure are presented. However, the examples described below are only for specifically illustrating or explaining the present disclosure, and the scope of the present disclosure is not limited thereto.

As shown in FIG. 1, the semiconductor device of Example 1 includes a P type shield region covering the bottom surface and edges of the trench, and an N type current diffusion region disposed on the side surface of the trench.

The semiconductor device of Comparative Example 1 has a general trench structure that does not include both the P type shield region and the N type current diffusion region and as shown in FIG. 2, the semiconductor device of Comparative Example 2 includes a P type shield region on the bottom surface of the trench, but the P type shield region does not cover the edge of the bottom surface of the trench.

Figure 15:
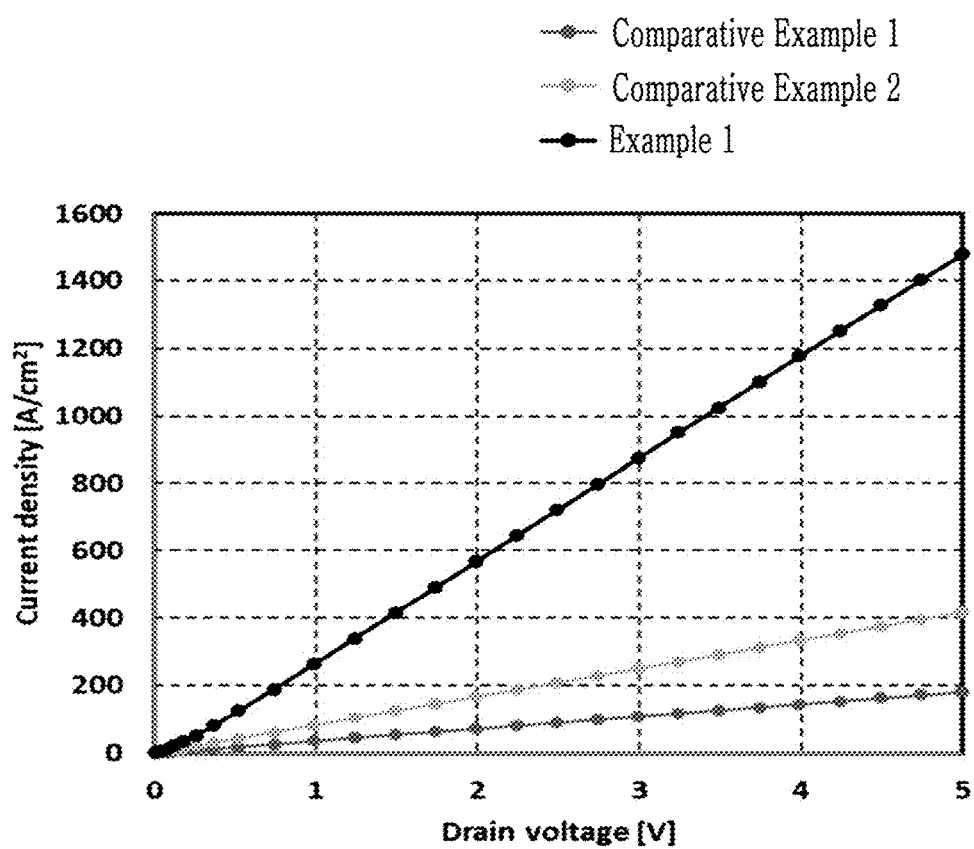
FIG. 15 is a graph illustrating on-state current density measurement results of the semiconductor devices manufactured in Comparative Example 1, Comparative Example 2, and Example 1.
Figure 16:
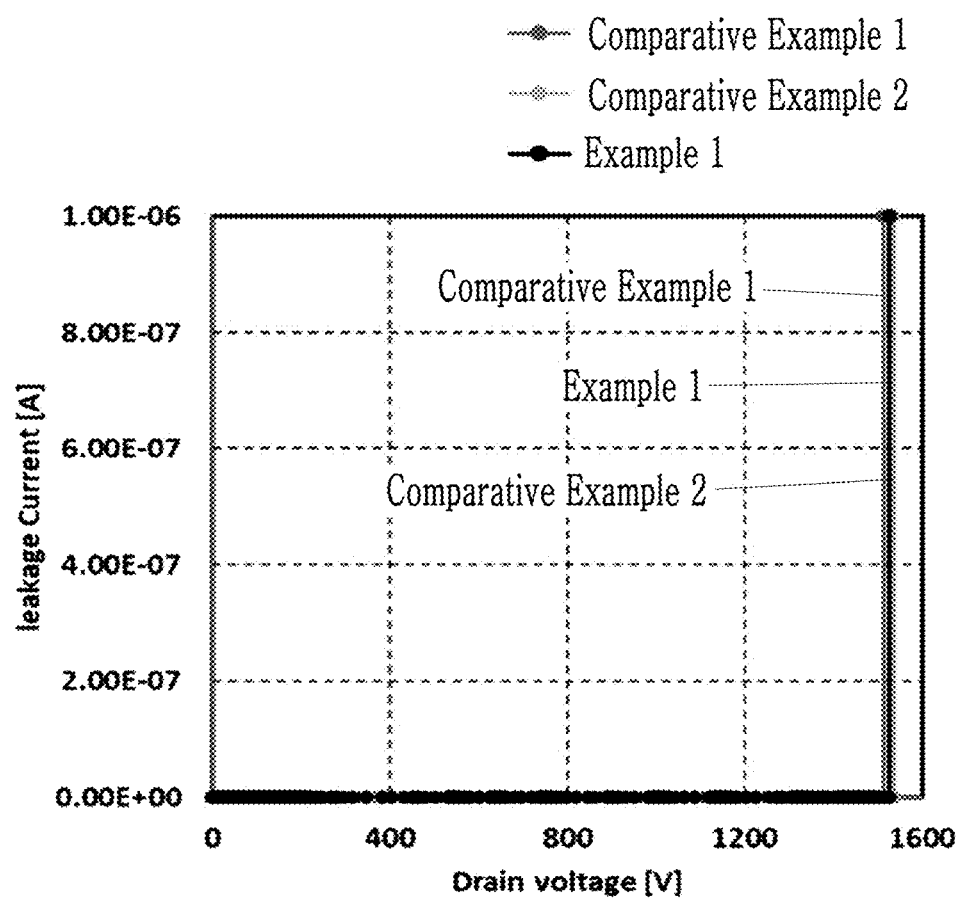
FIG. 16 is a graph illustrating off-state breakdown voltage measurement results of the semiconductor devices manufactured in Comparative Example 1, Comparative Example 2, and Example 1.

FIG. 15 is a graph showing the on-state current density measurement results of the semiconductor devices prepared in Comparative Example 1, Comparative Example 2, and Example 1, and FIG. 16 is a graph illustrating an off-state breakdown voltage measurement result of the semiconductor devices manufactured in Comparative Example 1, Comparative Example 2, and Example 1. In addition, the measurement results of FIGS. 15 and 16 are summarized in Table 1.

TABLE 1

|  | Example 1 | Comparative Example 2 | Comparative Example 1 |
|---|---|---|---|
| Current density [A/cm$^2$] (@$V_{DS}$ = 2.5 V) | 723.139 | 208.643 | 90.599 |
| Breakdown voltage [V] | 1525 | 1536 | 1510 |

Figure 17:
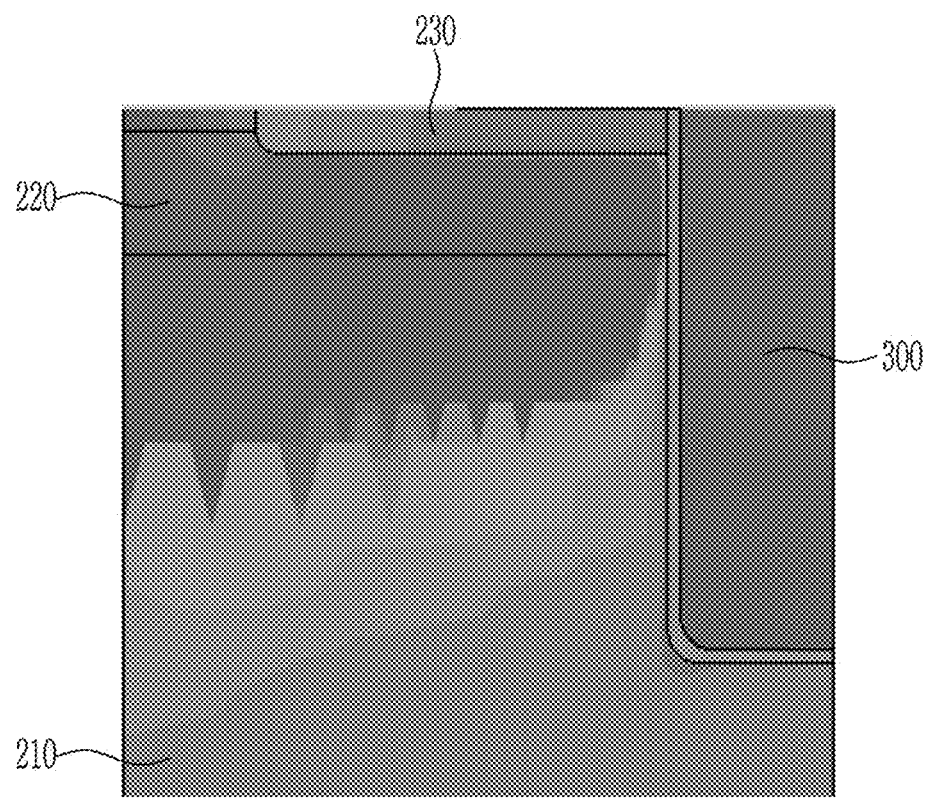
FIG. 17 is a view illustrating a current distribution measurement result of the semiconductor device manufactured in Comparative Example 1.
Figure 18:
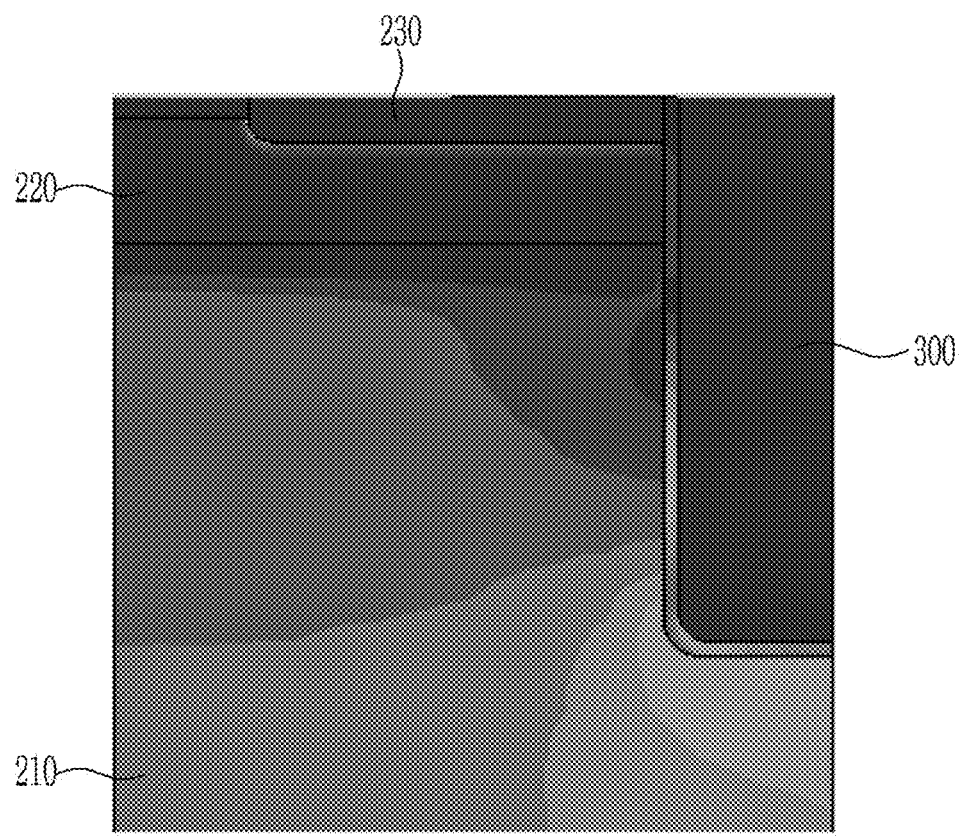
FIG. 18 is a view illustrating an electric field distribution measurement result of the semiconductor device manufactured in Comparative Example 1.
Figure 19:
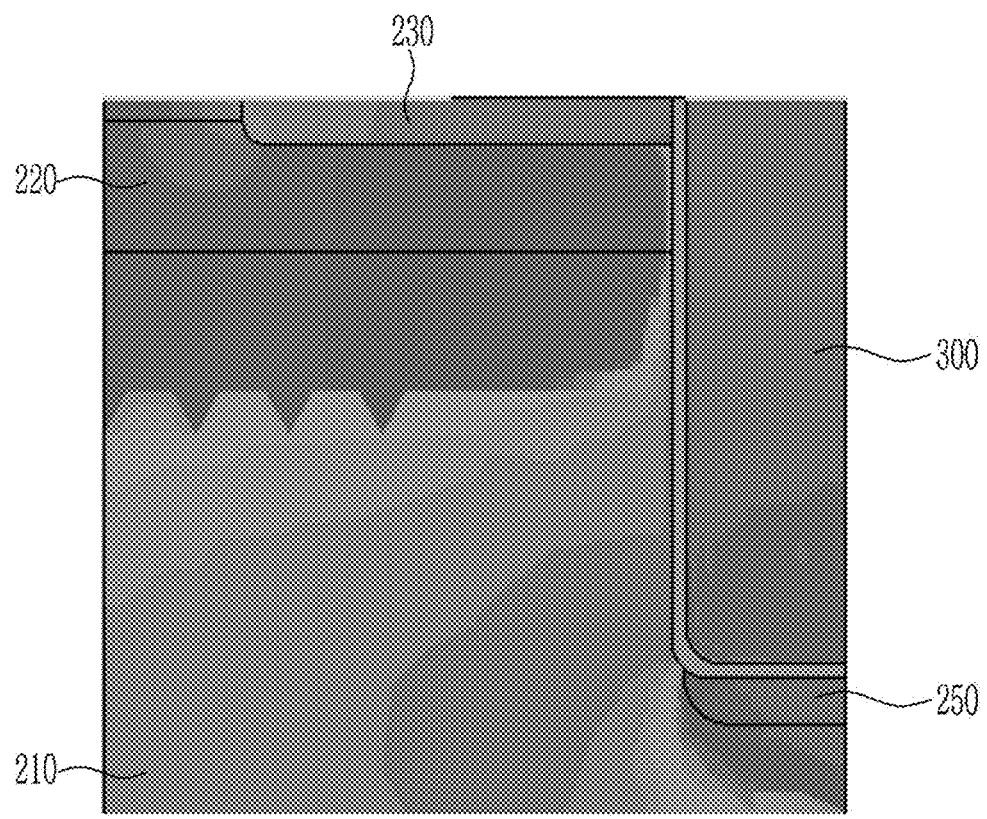
FIG. 19 is a view illustrating a current distribution measurement result of the semiconductor device manufactured in Comparative Example 2.
Figure 20:
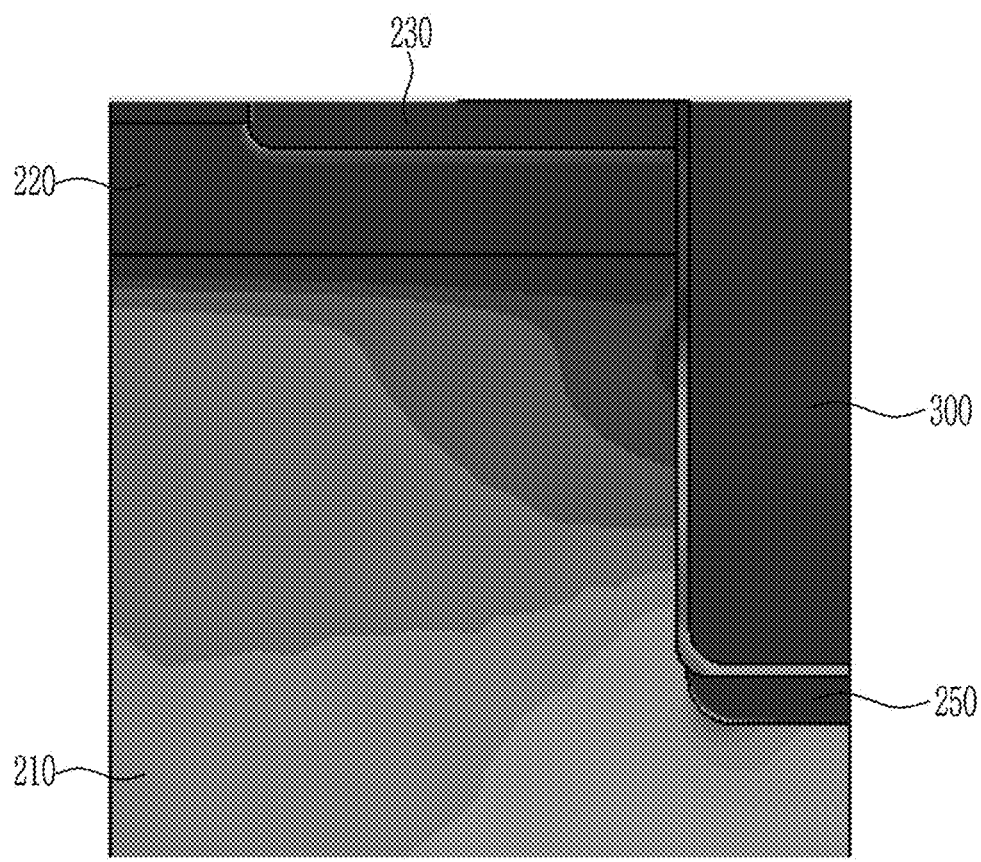
FIG. 20 is a view illustrating an electric field distribution measurement result of the semiconductor device manufactured in Comparative Example 2.
Figure 21:
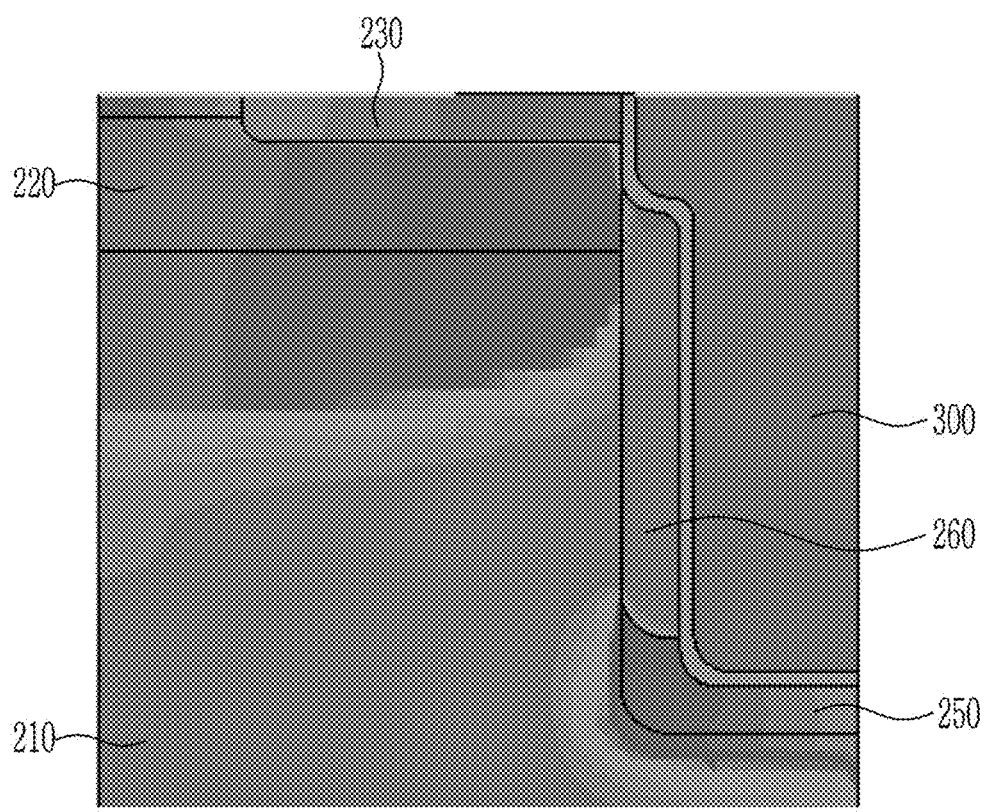
FIG. 21 is a view illustrating a current distribution measurement result of the semiconductor device manufactured in Example 1.
Figure 22:
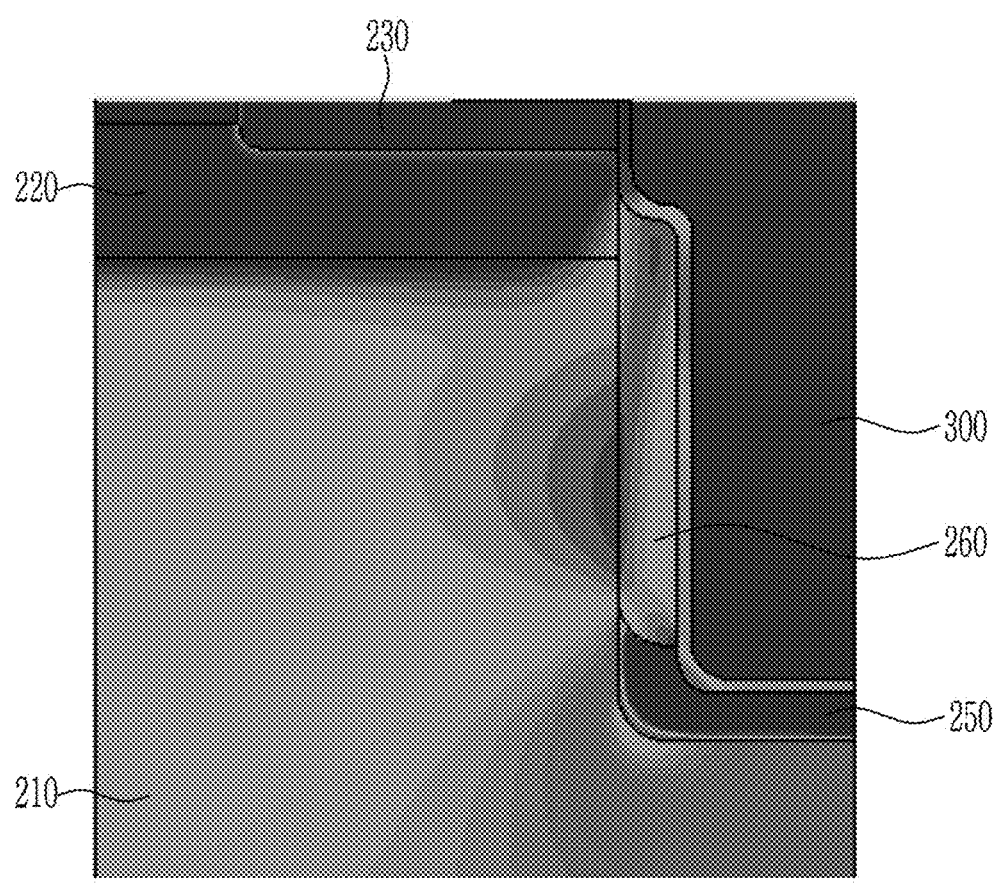
FIG. 22 is a view illustrating an electric field distribution measurement result of the semiconductor device manufactured in Example 1.

In addition, FIGS. 17 and 18 are views showing current distribution and electric field distribution measurement results of the semiconductor device manufactured in Comparative Example 1; FIGS. 19 and 20 are views showing current distribution and electric field distribution measurement results of the semiconductor device manufactured in Comparative Example 2, and FIGS. 21 and 22 are views showing current distribution and electric field distribution measurement results of the semiconductor device manufactured in Example 1. Measurements were performed with a Sentaurus TCAD from Synopsys.

Referring to FIGS. 15 to 22 and Table 1, the semiconductor device of Example 1 exhibited an increased current density compared to the semiconductor devices of Comparative Examples 1 and 2 at the equivalent breakdown voltage. Specifically, the on-state current density of the semiconductor device of Example 1 is increased by 698% compared to the semiconductor device of Comparative Example 1 at the equivalent breakdown voltage, and the on-state current density of the semiconductor device of Example 1 is increased by 246% compared to the semiconductor device of Comparative Example 2 at the same breakdown voltage.

Accordingly, the semiconductor device according to Example 1 protects an oxide film at the edge portion of the trench gate, and thus may prevent the oxide film from being destroyed and a breakdown voltage from being reduced due to a concentration of an electric field on the oxide film at the edge portion of the trench gate, and may prevent a current being reduced due to ion implantation to protect the edge portion of the trench gate, in particular, in a SiC-based semiconductor device. In addition, the semiconductor device of Example 1 may reduce a device cost by improving the number and yield of devices per unit wafer when designing an equivalent current area.

While the present disclosure has been described in connection with what is presently considered to be practical example embodiments, it is to be understood that the present disclosure is not limited to the disclosed embodiments. On the contrary, it is intended to cover various modifications and equivalent arrangements included within the spirit and scope of the appended claims.

What is claimed is:

1. A semiconductor device, comprising
an N+ type substrate;
an N− type layer disposed on a first surface of the N+ type substrate and having a trench opened to a surface opposite to the surface facing the N+ type substrate;
a P type region disposed in the N− type layer and disposed on a side surface of the trench;
a gate electrode disposed in the trench; and
a source electrode and a drain electrode insulated from the gate electrode,
wherein the N− type layer includes a P type shield region covering a bottom surface and an edge of the trench,
wherein the N− type layer includes an N type current diffusion region disposed on a side surface of the trench,
wherein the trench includes
a first trench region disposed in the P type region and having a first width, and
a second trench region disposed in the N− type layer and having a second width, wherein the first width of the first trench region is wider than the second width of the second trench region.

2. The semiconductor device of claim 1, wherein
the N type current diffusion region is disposed on the P type shield region.

3. The semiconductor device of claim 1, wherein
the P type shield region and the N type current diffusion region are connected to each other to cover the bottom and side surfaces of the trench.

4. The semiconductor device of claim 1, wherein
the first width of the first trench region is the same as a width of the P type shield region.

5. The semiconductor device of claim 1, wherein
a bottom surface of the first trench region having the first width is disposed in the P type region and not in the N− type layer.

6. The semiconductor device of claim 1, wherein
the second width of the second trench region is narrower than a width of the P type shield region.

7. The semiconductor device of claim 1, wherein
a bottom surface of the second trench region having the second width passes through the N type current diffusion region and is disposed in the P type shield region.

8. The semiconductor device of claim 1, wherein
the N type current diffusion region is disposed under a bottom surface of the first trench region having a first width, a side surface of the second trench region having a second width, and on an upper portion of the P type shield region.

9. The semiconductor device of claim 1, wherein
the gate electrode has a third width in the P type region and a fourth width in the N− type layer, and the third width of the gate electrode is wider than the fourth width.

10. The semiconductor device of claim 1, wherein
the semiconductor device further includes a first insulating layer disposed between the trench and the gate electrode.

11. The semiconductor device of claim 1, wherein
the gate electrode includes a first gate electrode region disposed in the trench and a second gate electrode region protruding above the trench.

12. The semiconductor device of claim 11, wherein
the semiconductor device further includes a second insulating layer covering the second gate electrode region protruding above the trench.

13. The semiconductor device of claim 1, wherein
the source electrode is disposed on the N− type layer, and the drain electrode is disposed on a second surface of the substrate.

14. A method of manufacturing a semiconductor device, comprising
forming an N− type layer on a first surface of an N+ type substrate;
forming a P type region in the N− type layer;
implanting P type ions with a first width into the N− type layer and the P type region to form a P type ion implantation region;
implanting N type ions with a first width to a partial depth of the P type ion implantation region to form an N type ion implantation region and a P type shield region under the N type ion implantation region;
etching the N type ion implantation region and the P type shield region to form a trench;
forming a gate electrode inside the trench; and
forming a source electrode and a drain electrode to be insulated from the gate electrode, respectively.

15. The method of claim 14, wherein
the forming of the P type ion implantation region includes forming a first mask having an opening of a first width on the P type region, and then using the first mask, implanting P type ions into the N− type layer and the P type region with a first width to form a P type ion implantation region.

16. The method of claim 15, wherein
the forming of the trench includes etching the N type ion implantation region to a partial depth using a first mask to form a first trench region having a first width.

17. The method of claim 16, wherein
the etching of the N type ion implantation region is performed such that a bottom surface of the first trench region having the first width is disposed in the P type region and not in the N– type layer.

18. The method of claim 16, wherein
the forming of the trench includes forming a second mask having an opening having a second width on a side surface of the first trench region, and then using the second mask, etching the P type shield region to a partial depth penetrating the N type ion implantation region to form a second trench region having a second width.

19. The method of claim 18, wherein
the etching of the P type shield region is performed such that a bottom surface of the second trench region having the second width passes through the N type current diffusion region and is disposed in the P type shield region.

20. The method of claim 19, wherein
the method of manufacturing the semiconductor device further includes forming a first insulating layer on the bottom and side surfaces of the second trench region, the bottom and side surfaces of the first trench region, and the P type region.

21. The method of claim 14, wherein
the forming of the P type shield region is performed by using an ion doping neutralization (compensation) method.

22. The method of claim 21, wherein
a difference between an amount of N type ions implanted to form the N type ion implantation region and an amount of P type ions implanted to form the P type ion implantation region is greater than an ion implantation concentration of the N– type layer.

23. The method of claim 14, wherein
the method of manufacturing the semiconductor device further includes forming a second insulating layer on the gate electrode after forming the gate electrode in the trench.

24. The method of claim 14, wherein
the method of manufacturing the semiconductor device further includes forming an N+ type region disposed in the P type region and disposed on a side surface of the trench.

25. The method of claim 14, wherein
the method of manufacturing the semiconductor device further includes forming a source electrode on the P type region to be insulated from the gate electrode.

26. The method of claim 14, wherein
the method of manufacturing the semiconductor device further includes forming a drain electrode on the second surface of the substrate.

* * * * *